US006882781B2

(12) United States Patent
Ionov

(10) Patent No.: US 6,882,781 B2
(45) Date of Patent: Apr. 19, 2005

(54) COHERENT POWER COMBINING OF SINGLE-MODE SOURCES IN WAVEGUIDE FIBER COUPLERS

(75) Inventor: Stanislav I. Ionov, Calabasas, CA (US)

(73) Assignee: HRL Laboratories, LLC, Malibu, CA (US)

(*) Notice: Subject to any disclaimer, the term of this patent is extended or adjusted under 35 U.S.C. 154(b) by 0 days.

(21) Appl. No.: 10/154,579

(22) Filed: May 23, 2002

(65) Prior Publication Data

US 2003/0099439 A1 May 29, 2003

Related U.S. Application Data

(60) Provisional application No. 60/332,575, filed on Nov. 16, 2001.

(51) Int. Cl.[7] .................................................. G02B 6/26
(52) U.S. Cl. .................................... 385/48; 385/39
(58) Field of Search ........................... 385/15, 39, 48

(56) References Cited

U.S. PATENT DOCUMENTS

| 5,233,673 | A | 8/1993 | Vali et al. ..................... 385/3 |
| 5,694,408 | A | 12/1997 | Bott et al. ..................... 372/6 |
| 5,737,459 | A | * 4/1998 | Epworth et al. ............... 385/15 |
| 5,946,130 | A | 8/1999 | Rice ............................ 359/349 |
| 6,233,085 | B1 | 5/2001 | Johnson ...................... 359/279 |
| 6,400,871 | B1 | 6/2002 | Minden ........................ 385/39 |
| 6,417,948 | B1 | * 7/2002 | Chowdhury et al. ......... 398/158 |
| 6,580,534 | B1 | * 6/2003 | Madsen ....................... 398/63 |
| 2001/0016014 | A1 | * 8/2001 | Nam ........................... 375/285 |
| 2003/0132800 | A1 | * 7/2003 | Kenington .............. 330/124 R |

FOREIGN PATENT DOCUMENTS

EP    0 980 123 A2    2/2000

OTHER PUBLICATIONS

Haus, H., "Coupling of Modes in Space", *Waves and Fields in Optoelectronics*, Prentice–Hall, Englewood Cliffs, Sec. 7.6, pp. 217–220 (1984).

* cited by examiner

*Primary Examiner*—John D. Lee
*Assistant Examiner*—Tina M Lin
(74) *Attorney, Agent, or Firm*—Ladas & Parry LLP

(57) ABSTRACT

An optical power combining system. The system may comprise: a means for splitting an optical source into multiple channels; amplifiers in the multiple channels; and waveguide couplers for coherently combining the multiple channels into a single output.

20 Claims, 3 Drawing Sheets

FIG. 1. A fiber (waveguide) couple
(Prior Art)

COHERENT POWER COMBINING OF SINGLE-MODE SOURCES IN WAVEGUIDE FIBER COUPLERS

CROSS-REFERENCES TO RELATED APPLICATIONS

CLAIM OF BENEFITS OF PROVISIONAL APPLICATION

Applicants claim the benefits of their United States Provisional application Ser. No. 60/332,575, filed on 16 Nov. 2001 now abandoned.

The present document is related to the co-pending and commonly assigned U.S. patent application Ser. No. 09/574,282 filed May 19, 2000, which is hereby incorporated herein by reference.

TECHNICAL FIELD

This invention relates to optical power amplification. In particular, it relates to power amplification using optical couplers through coherent combination of amplified signals.

BACKGROUND OF THE INVENTION

Optical power amplification has relevance to terrestrial and space applications. A well-known terrestrial application requiring optical power amplification is laser radars for missiles. A well-known space application requiring optical power amplification is inter-satellite optical communications. Such applications may require optical power outputs at 10W or higher.

Scaling output power of fiber lasers and amplifiers above a 10W level is a challenging task for a number of reasons. Although fiber lasers and amplifiers operating in a 10–20W range have been demonstrated, such devices use diode pumps with relatively short lifetimes, which rule out the possibility of using diode pumps in space applications. In addition, high power fiber lasers and amplifiers are prone to spontaneous mode locking, Q-switching and high-intensity relaxation oscillations. These processes create spikes of high intensity that damage fiber ends.

One solution to the problem of power scaling fiber lasers and amplifiers can be found in the commonly assigned U.S. patent application Ser. No. 09/574,282 filed May 19, 2000, as referenced above. In this application, controlling the phase of fiber amplifiers has been demonstrated by adjusting the pump power of individual amplifiers. When phase-locked, the output beam in the far zone consists of a number of bright, diffraction-limited spots whose individual intensities are considerably higher than those of a non-locked output.

A need still exists for an apparatus and a method that enables power scaling of an optical system while maintaining beam quality.

SUMMARY OF THE INVENTION

It is an object of the present invention to enable optical power scaling using a plurality of relatively low-power amplifiers while maintaining beam quality. It is a further object of the present invention to coherently combine the outputs of the plurality of relatively low-power, fiber amplifiers in a power scaling system that provides either higher output power or equal output power, and has a longer lifetime than systems that use high power amplifiers.

One embodiment of the present invention combines the output energies of a plurality of optical channels that comprise relatively low-power, fiber amplifiers into a single diffraction-limited spot by coherently combining the output of multiple fiber amplifiers in waveguide couplers, such as 3 dB fiber couplers. The coherent combination of the output energy in the fiber preserves the mode quality of the initial beam. In addition, the coherent combining in waveguide couplers allows not just the intensities of the optical signals to be summed, but the electric fields as well, providing for an output beam that can be focused to a smaller spot beam than is available through other power combining methods. Hence, power scaling of relatively low-power and thus reliable fiber amplifiers is accomplished while retaining beam quality, which is extremely difficult to get with conventional power combining schemes.

Alternatively, the embodiment enables powering down diode pumps while maintaining the same output power of the combined fiber source.

Another embodiment of the present invention is an optical power combining system comprising: an optical splitter receiving an optical signal and providing a plurality of splitter outputs; a plurality of optical channels at least one optical channel of said plurality of optical channels comprising an amplifier coupled to a waveguide, each optical channel being coupled to a corresponding splitter output and each channel producing a corresponding channel output; an optical combining network comprising of one or more waveguide couplers, said optical combining network coupled to one or more of the channel outputs of the plurality of optical channels, said optical combining network coherently combining, in said one or more waveguide couplers, the channel outputs into one or more combined outputs; and a feedback loop having a feedback input and one or more feedback outputs, said feedback input being coupled to at least one of said one or more combined outputs, and said one or more feedback outputs being coupled to one or more of said amplifiers.

Yet another embodiment of the present invention is a method for power combining optical signals comprising the steps of: generating a plurality of amplified optical signals, each of said amplified optical signals having an electric field and a phase; controlling phase of each amplified optical signal of said plurality of amplified optical signals resulting in a plurality of phase controlled amplified optical signals; and coherently combining, in waveguide couplers, said electric fields of said plurality of phase controlled amplified optical signals into at least one combined output.

Yet another embodiment of the present invention is a method for coherent combination of optical signals comprising the steps of: splitting an optical signal into a plurality of split optical signals, each split optical signal having a phase; coherently combining said plurality of split optical signals through an optical combining network of waveguide couplers into a single output signal; detecting said phase of at least one of said plurality of split optical signals in said single output signal; and controlling said phase of said plurality of split optical signals based on said detected phase of at least one of said plurality of split optical signals in said single output signal.

Yet another embodiment of the present invention is a coherent optical power combining system comprising: an optical splitter receiving an optical signal and providing a plurality of splitter outputs; a plurality of optical channels, each optical channel comprising an amplifier coupled to a waveguide each optical channel being coupled to a corresponding splitter output and each channel producing a corresponding channel output; an optical combining network coupled to the channel outputs of the plurality of optical channels, said optical combining network coherently combining the channel outputs into one or more combined outputs; and a feedback loop having a feedback input and one or more feedback outputs, said feedback input being coupled to at least one of said one or more combined outputs, and said one or more feedback outputs being coupled to one or more optical channels.

DETAILED DESCRIPTION

Figure 1:
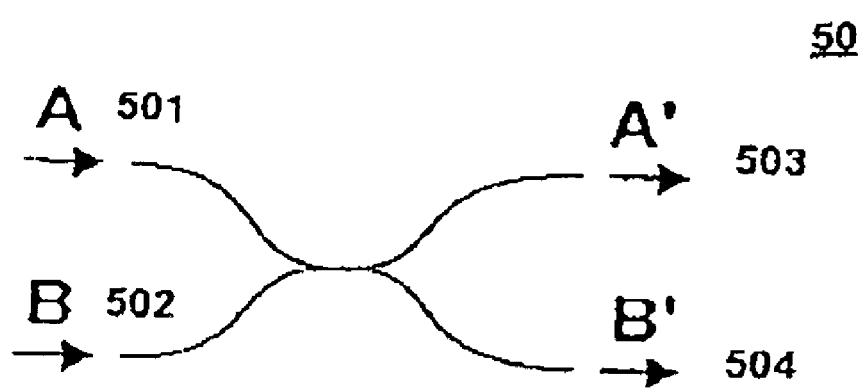
FIG. 1 (prior art) depicts a fiber (waveguide) coupler as known in the prior art.

FIG. 1 depicts a fiber or waveguide coupler as known in the prior art. The operational principle of the present invention is based on well known properties of fiber (or waveguide) couplers as can be found in H. A. Haus, "Waves and Fields in Optoelectronics," Prentice-Hall, Englewood Cliffs, 1984, pp. 217–220. The amplitudes of output optical waves exciting a coupler made of identical fibers or waveguides are given, respectively by the formulas $$A' = \left[ A \cos(|\kappa_{12}|z) + \frac{\kappa_{12}}{|\kappa_{12}|} B \sin(|\kappa_{12}|z) \right] e^{i\beta c} \quad (1)$$

$$B' = \left[ \frac{\kappa_{21}}{|\kappa_{12}|} A \sin(|\kappa_{12}|z) + B \cos(|\kappa_{12}|z) \right] e^{-i\beta c}$$

where A and B are complex amplitudes for the corresponding input waves, z is the length of the coupling region, $\kappa_{12}$ and $\kappa_{21}$ are complex coupling constants with $\kappa_{12}=\kappa^*_{21}$, and $\beta$ is the propagation wavenumber, which is assumed to be the same in both waveguides. In 3 dB, (i.e., 50×50 couplers), $\kappa_{12}z=[\pi e^{i\phi}]/4$, where $\phi$ may take on any value. For illustrative purposes we assume $\phi=0$. Other values of $\phi$ require different relative phases of the input beams for achieving the same effects and therefore do not affect the final conclusions. Thus, equation 1 becomes $$A' = \frac{1}{\sqrt{2}} [A+B] e^{i\beta c} \quad (2)$$

$$B' = \frac{1}{\sqrt{2}} [-A+B] e^{-i\beta c}$$

When both amplitudes and phases of the input waves A and B are equal, the output of the coupler is directed to the upper arm of a fiber (waveguide) coupler as shown in FIG. 1, i.e., $A'=\sqrt{2}A e^{i\beta c}$, $B'=0$. The output is redirected from A' to B' by changing the relative phases of A and B from 0 to $\pi$. Therefore, the branching ratio of a 3 dB coupler can be completely controlled by changing the relative phases of the input beams. Therefore, providing equal amplitudes and phases to the input of a single coupler provides the maximum output power out of the coupler.

Figure 2:
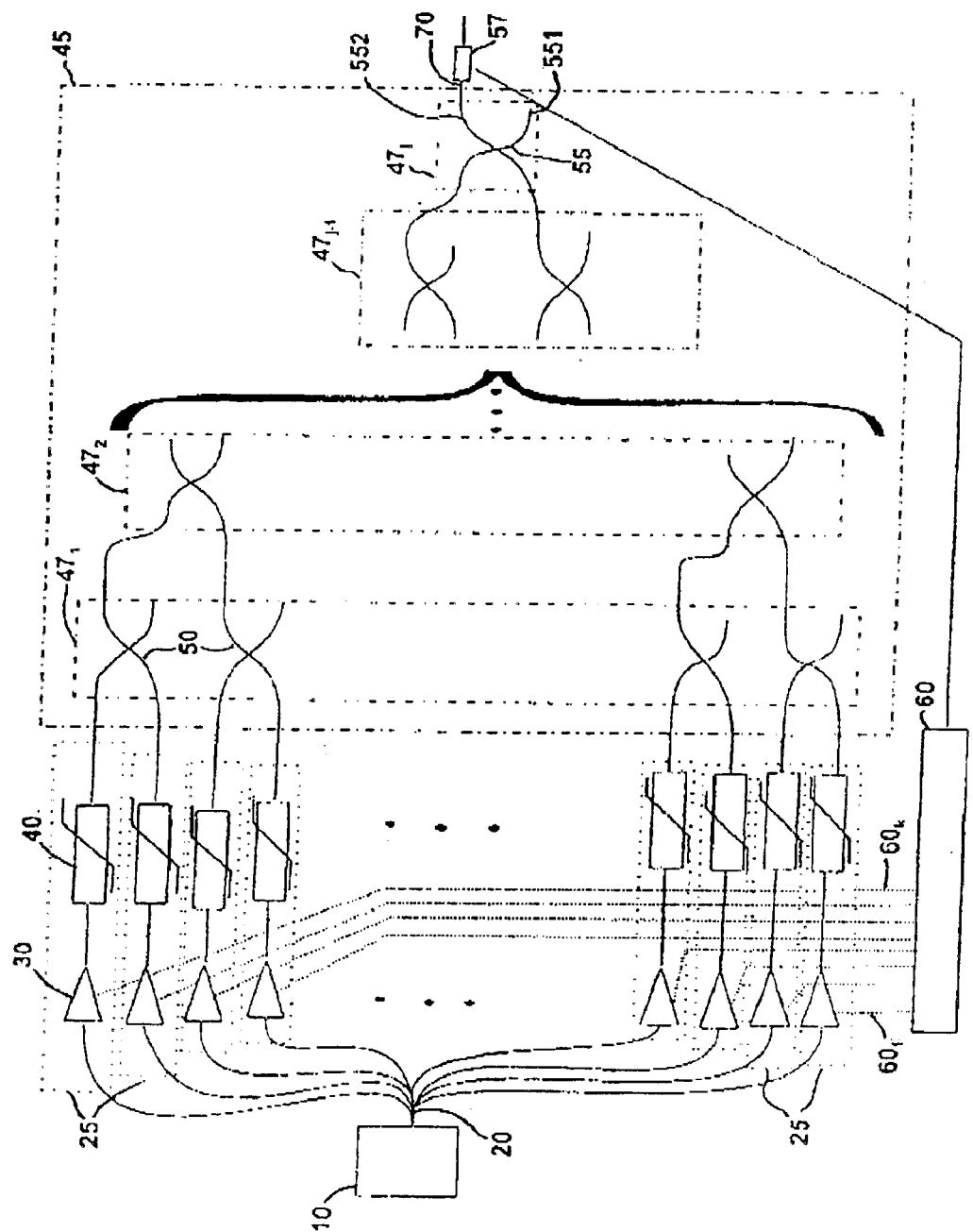
FIG. 2 is a schematic of one embodiment of the present invention, including an optical source, amplifiers and 3 dB couplers.

FIG. 2 is a schematic of one embodiment of the present invention. An optical source 10, (e.g., a CW laser diode or a pulsed laser or any single mode source), provides an optical signal into an optical splitter 20. The optical splitter 20 splits the optical signal into a plurality of optical channels 25. The optical splitter 20 may be a commercial waveguiding device, e.g. JDS Uniphase (San Jose, Calif.) ACWA Series 1×N wideband single-mode splitters/combiners (e.g., a star coupler), a number of 3 dB couplers arranged in a tree-limb fashion, or any other combination of devices providing N optical channels from one optical signal, where N is preferably a power of 2, i.e., 2, 4, 8, 16, etc.

Figure 3:
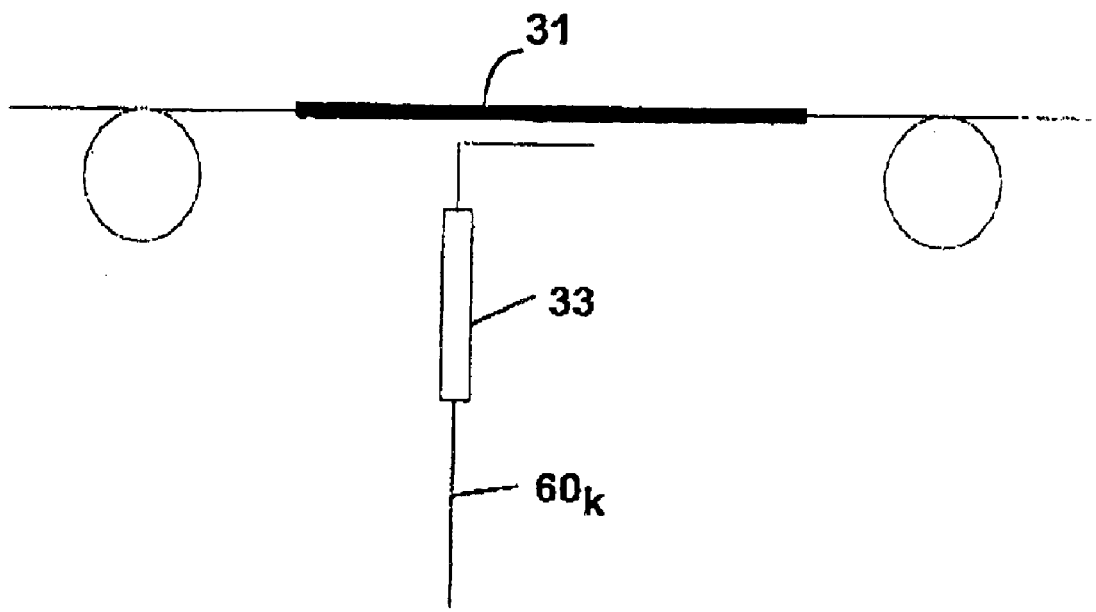
FIG. 3 (prior art) depicts a fiber amplifier as known in the prior art.

At least a subset of the outputs of the optical splitter 20 are launched into a separate optical channel 25. Each optical channel 25 preferably comprises an optical waveguide, (e.g., a fiber) coupled to an amplifier 30. Possible amplifiers for use in this embodiment are erbium-doped fiber optical amplifiers (EDFAs) or erbium:ytterbium-doped fiber optical amplifiers (EYDFAs) or semiconductor amplifiers. Fiber optical amplifiers, as shown in FIG. 3, typically consist of fibers 31 with dopant in the core pumped by a laser pump 33. Fiber optical amplifiers are commercially available, e.g. JDS Uniphase MAFA 1000 Series.

The lengths of each optical path defined from the optical source 10 to the output of the system 70 are preferably equal to each other within a tolerance determined by the application. The difference in the length between the paths divided by the propagation speed, c/n, (where c is the speed of light and n is the index of refraction) is preferably much smaller than the characteristic duration of the transmitted signal. For example, if a communication signal with a data rate of R=10 Gb/s is used, the relative delays between the paths is preferably much less than the bit duration t=1/R, which results in a path difference less than or equal to 0.1 mm. The preferred method to accomplish the nearly identical path lengths is to precisely cut the individual fiber pieces before splicing. However, if a very high tolerance is sought, (e.g., for very high speed communications), adjustable delay lines are preferable. Delay lines are commercially available with a dynamic range of $0.1 \times 10^{-12}$ s through $100 \times 10^{-12}$ s, from JDS Uniphase or Santech USA (Hackensack, N.J.). Preferably, these delay lines 40 may be inserted into all but one path. The path without a delay line functions as the constant to which the delay of the other paths is matched. Alternatively, each path may contain a delay line with one path being held constant while the delay of each of the other paths is adjusted to match.

The output of each optical channel 25 is coupled to an optical combining network 45. The optical combining network 45 preferably comprises one or more waveguide couplers 50, (e.g., 3 dB couplers), cascaded in a tree-limb fashion toward one or more combined outputs producing a series of combining cascades. The optical combining network 45 may also comprise one or more waveguide couplers 55 configured in a parent-child cascading network. The inputs of the child couplers being coupled to the outputs of the parent couplers. The optical combining network 45 of waveguide couplers 50 is used to continue coupling the signals from the plurality of optical channels 25 and subsequent waveguide couplers 50, until the number of combined outputs is provided. In the preferred embodiment, the optical combining network 45 couples the signals from the plurality of optical channels 25 until there is a final waveguide coupler 55 providing one combined output 70. Thus, the optical combining network 45 coherently combines the optical channel 25 outputs into one or more combined outputs. Each 3 dB coupler has a first input 501, a second input 502, a first output 503 and a second output 504, as shown in FIG. 1. The waveguide couplers provide the capability, as described above, for combining the inputs and directing the combined inputs preferably to a single combined output. Specifically, 3 dB couplers, as described above, are preferably used to provide this capability.

For the preferred system where the optical splitter 20 provides N optical channels 25 and N is a power of 2, the waveguide couplers 50, (e.g., 3 dB couplers), may be broken up into one or more sets $47_j$, where k equals the total number of sets. N and k follow the equation $N=2^k$. The number of waveguide couplers in the jth set follows the equation $N/2^j$, where j is in the range from 1 to k. Each set $47_j$ is arranged such that each of the first outputs 503 of the waveguide couplers in a jth set is coupled to one of the inputs of a waveguide coupler in a jth+1 set. For j=1, set $47_1$ is coupled to the plurality of optical channels 25. Given the symmetry of waveguide couplers the second output 504 could be used in place of the first output 503 in the above description. The following table provides a few examples for the relationships between N, k and j.

| | # of waveguide couplers when j = 1 | # of waveguide couplers when j = 2 | # of waveguide couplers when j = 3 | # of waveguide couplers when j = 4 |
|---|---|---|---|---|
| N = 2, k = 1 | 1 | 0 | 0 | 0 |
| N = 4, k = 2 | 2 | 1 | 0 | 0 |
| N = 8, k = 3 | 4 | 2 | 1 | 0 |
| N = 16, k = 4 | 8 | 4 | 2 | 1 |

In a second embodiment when N is not a power of 2, N and k follow the equation $2^{k-1}<N\leq2^k$. The maximum number of waveguide couplers in the jth set follows the equation of $N/2^j$. The sets are arranged in the same manner as previously discussed to form the optical network 45.

Based on the foregoing discussion, a person skilled in the art will appreciate that other embodiments of the present invention may have an optical combining network 45 that comprises any waveguide couplers, (e.g., star couplers, 1×N couplers), that combine input channels into an output channel with equal weights. The optical combining network 45 of 3 dB couplers 50 is chosen for illustrative purposes.

After all of the channels have been coupled to form one or more combined outputs, an optical tap 57 preferably couples approximately 1% of the output signal from the single combined output 70. Optical tap 57 can take the form of any fiber coupler with a preferred coupling efficiency of 1%, e.g. JDS Uniphase Part No. L2SEWF15AA01.

The entered coupled signal is then passed to a feedback loop 60 where the relative phase of each amplifier is determined based on the frequency dithering introduced at the amplifier. The input to feedback loops 60 is the coupled signal preferably from the optical tap 57. The outputs of the feedback loops 60 are coupled to the corresponding amplifiers 30.

Feedback loops 60 are preferably based on a dither-locking method used for frequency and phase stabilization of lasers. The dither-locking method is applied to the phase control of the plurality of amplifiers in the disclosed system. Each amplifier's phase is independently controlled by the corresponding feedback line $60_k$, where k varies from 1 to the total number of amplifiers in the system. If the amplifier 30 comprises a fiber amplifier, then the radiation phase output of the fiber amplifier 30 may be controlled by adjusting the current driving the pump laser 33, as shown in FIG. 3. If the amplifier 30 comprises a semiconductor amplifier, then the radiation phase output of the semiconductor amplifier may be adjusted by changing its driving current.

Frequency dithering is introduced at the amplifier 30 by dithering the drive current. The drive current in preferably all but one of the optical channels is dithered at an individually chosen frequency ranging from 100 Hz to a few KHz. The optical channel without a dither is called the reference channel. For purposes of this explanation, the dither frequency is $\Omega_k$, where k varies from 1 to the total number of amplifiers, with each amplifier having a different dither frequency. By dithering the current driving the pump laser 33 at a fiber amplifier 30, FM sidebands are added at frequencies $\omega\pm\Omega_k$, where $\omega$ is the frequency of the optical source 10. The dither amplitudes are preferably chosen such that the overall system SNR is not reduced. In the preferred embodiment, $\Omega_k$ is chosen such that the difference between any two dither frequencies is preferably between 1% and 20% of the frequency $\Omega_k$, depending upon the application. The signal from the optical tap 57 is then split and provided to a plurality of lock-in amplifiers, preferably with a lock-in amplifier corresponding to each one of the dithered amplifiers 30 in the optical channels 25. The lock-in amplifiers preferably provide the dither frequency to the optical amplifiers 30.

The lock-in amplifiers compare the signal from the optical tap 57 with the corresponding dither frequency $\Omega_k$. The lock-in amplifiers generate an error signal whose amplitude is proportional to the magnitude of the $\Omega_k$ harmonic in the coupled optical signal from the optical tap 57 and whose sign is determined by the relative phase of the dither frequency $\Omega_k$ and the $\Omega_k$ harmonic in the coupled optical signal. The current of the corresponding optical amplifier is adjusted in proportion to the error signal. The error signal is provided via outputs of the feedback loop $60_k$ to the corresponding amplifier 30. The maximum change in the current should not result in an output phase change larger than $2\pi$. Such small changes in pump current do not cause significant changes in the amplifier gain.

Those skilled in the art will appreciate that there are other methods that may be used to adjust the phase of the amplifier including changing the temperature or adjusting the phase in a phase modulator inserted in each channel. Preferably the phase is adjusted such that all of the optical output is directed into a single arm of the last 3 dB coupler 55. Since all the light stays within a single-mode fiber, diffraction limited beam quality is guaranteed at the output of the system 70.

The coherent combination of the amplified optical channels into at least a single output beam 70 allows for a power scaling of low energy amplifiers. The adjustment of the gain and phase of the optical channels 25 to provide the identical amplitude and phase at the input of each of the 3 dB couplers 50 in the optical network 45 allows for most of the energy in the system to be concentrated into a single output beam 70. Thus, power scaling of single mode sources is obtained. Typically, 1 to 4 Watts of power may be obtained from a single cladding-pumped fiber amplifier (EDFA or EYDFA) with space-qualified diode pumps. According to the present invention, the output power can be scaled to more than 10 to 100 Watts by using multiple amplifiers while retaining the beam quality or mode quality. Alternatively, with the present invention the multiple pump diodes at the amplifiers may be driven by lower current, resulting in significantly extending the lifetime of the system.

Although the invention has been described in conjunction with one or more embodiments, it will be apparent to those skilled in the art that other alternatives, variations and modifications in light of the foregoing description are within the spirit and scope of the invention. Thus, the invention described herein is intended to embrace all such alternatives, variations and modifications that are within the spirit and scope of the following claims.

What is claimed is:

1. An optical power combining system comprising:
   an optical splitter receiving an optical signal and providing a plurality of splitter outputs;
   a plurality of optical channels, at least one optical channel of said plurality of optical channels comprising an amplifier coupled to a waveguide, each optical channel being coupled to a corresponding splitter output and each channel producing a corresponding channel output;
   an optical combining network comprising one or more waveguide couplers, said optical combining network coupled to one or more of the channel outputs of the plurality of optical channels, said optical combining network coherently combining, in said one or more waveguide couplers, the channel outputs into one or more combined outputs; and
   a feedback loop having a feedback input and one or more feedback outputs, said feedback input being coupled to at least one of said one or more combined outputs, and said one or more feedback outputs being coupled to one or more of said amplifiers;
   wherein at least one amplifier has a laser pump and a current driving said laser pump is adjusted, thereby introducing a dithered frequency in an associated optical channel.

2. The optical power combining system of claim 1 wherein at least one amplifier comprises an erbium-doped fiber amplifier (EDFA), an erbium-ytterbium doped fiber amplifier (EYDFA) or a semiconductor amplifier.

3. The optical power combining system of claim 1 wherein the channel outputs are frequency dithered.

4. The optical power combining system of claim 1 wherein said optical signal is provided by a pumped single mode optical source.

5. The optical power combining system of claim 1 wherein said waveguide couplers have a first input, a first output, a second input and a second output, and wherein said optical combining network comprises one or more of the waveguide couplers configured in a parent-child cascading network, the first input of a child waveguide coupler coupled to the first output of a first parent waveguide coupler, and the second input of the child waveguide coupler coupled to the first output of a second parent waveguide coupler.

6. The optical power combining system of claim 1 wherein at least one waveguide coupler is a 3 dB coupler.

7. The optical power combining system of claim 1 wherein said plurality of optical channels is equal to N and wherein said one or more waveguide couplers are arranged in k sets, wherein N and k follow the equation N=2k, said waveguide couplers having a plurality of inputs, a first output, and a second output, wherein a jth set of waveguide couplers comprises N/2j waveguide couplers where j is in the range of 1 to k, wherein said first output of each of said waveguide couplers in the jth set is connected to at least one of said plurality of inputs of said waveguide coupler in a jth+1 set, said jth set when j=1 being coupled to said plurality of optical channels.

8. The optical power combining system of claim 1 wherein said plurality of optical channels are equal to N and wherein said one or more waveguide couplers are arranged in k sets, wherein N and k follow the equation 2k−1<N≦2k, said waveguide couplers having a plurality of inputs, a first output, and a second output, wherein a jth set of waveguide couplers comprises a maximum number of waveguide couplers, N/2j, where j is in the range of 1 to k, wherein said first output of each of said waveguide couplers in the jth set is connected to at least one of said plurality of inputs of said waveguide coupler in a jth +1 set, said jth set when j=1 being coupled to said plurality of optical channels.

9. An optical power combining system comprising:
   an optical splitter receiving an optical signal and providing a plurality of splitter outputs;
   a plurality of optical channels, at least one optical channel of said plurality of optical channels comprising an amplifier coupled to a waveguide, each optical channel being coupled to a corresponding splitter output and each channel producing a corresponding channel output;
   an optical combining network comprising one or more waveguide couplers, said optical combining network coupled to one or more of the channel outputs of the plurality of optical channels, said optical combining network coherently combining, in said one or more waveguide couplers, the channel outputs into one or more combined outputs; and
   a feedback loop having a feedback input and one or more feedback outputs, said feedback input being coupled to at least one of said one or more combined outputs, and said one or more feedback outputs being coupled to one or more of said amplifiers;
   wherein at least one optical channel of said plurality of optical channels further comprises a delay line coupled to said waveguide of said at least one optical channel.

10. The optical power combining system of claim 9 wherein said delay line is an adjustable delay line.

11. The optical power combining system of claim 1 further comprising an optical tap element being coupled to one of said one or more combined outputs, said optical tap providing a coupled output port and wherein said feedback input being coupled to said coupled output port.

12. A method for power combining optical signals comprising:
   generating a plurality of amplified optical signals, each of said amplified optical signals having an electric field and a phase;
   controlling the phase of each amplified optical signal of said plurality of amplified optical signals resulting in a plurality of phase controlled amplified optical signals;
   coherently combining, in waveguide couplers, said electric fields of said plurality of phase controlled amplified optical signals into at least one combined output; and
   adjusting delay of one or more of said plurality of phase controlled amplified optical signals, whereby all of said plurality of chase controlled amplified optical signals have equal delay.

13. The method of claim 12 wherein the step of controlling the phase of each amplified optical signal further comprises:
   generating frequency dither in at least one of said plurality of amplified optical signals;
   detecting said generated frequency dither in said at least one combined output; and
   adjusting the phase of the at least one amplified optical signal based on the detected frequency dither whereby said generated frequency dither is present in said at least one combined output.

14. The method of claim 12 wherein the step of generating a plurality of amplified optical signals comprises coupling an optical signal into an amplifier.

15. The method of claim 14 wherein at least one amplifier comprises an erbium-doped fiber amplifier (EDFA), an erbium-ytterbium doped fiber amplifier (EYDFA) or a semiconductor amplifier.

16. A method for coherent combination of optical signals comprising:

splitting an optical signal into a plurality of split optical signals, each split optical signal having a phase;

coherently combining said plurality of split optical signals through an optical combining network of waveguide couplers into a single output signal;

detecting said phase of at least one of said plurality of split optical signals in said single output signal; and controlling said phase of said plurality of split optical signals based on said detected phase of at least one of said plurality of split optical signals in said single output signal; and adjusting delay of at least one of said plurality of split optical signals, whereby all of said plurality of split optical signals have equal delay.

17. The method of claim 16 wherein detecting said phase of at least one of said plurality of split optical signals further comprises:

generating frequency dither in at least one of said plurality of split optical signals; and detecting said generated frequency dither in said single output signal.

18. The method of claim 16 wherein controlling said phase of said plurality of split optical signals comprises coupling said plurality of split optical signals into a plurality of amplifiers.

19. The method of claim 18 wherein at least one amplifier comprises an erbium-doped fiber amplifier (EDFA), an erbium-ytterbium doped fiber amplifier (EYDFA) or a semiconductor amplifier.

20. The method of claim 16 wherein said waveguide couplers are 3 dB couplers.

* * * * *